United States Patent
Laughlin et al.

(10) Patent No.: US 11,079,412 B1
(45) Date of Patent: Aug. 3, 2021

(54) OPTICAL CURRENT MONITOR

(71) Applicant: HONEYWELL FEDERAL MANUFACTURING & TECHNOLOGIES, LLC, Kansas City, MO (US)

(72) Inventors: Daric Gray Laughlin, Overland Park, KS (US); Christopher Scott Marchman, Overland Park, KS (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 335 days.

(21) Appl. No.: 16/244,317

(22) Filed: Jan. 10, 2019

(51) Int. Cl.
| | |
|---|---|
| *G02F 1/09* | (2006.01) |
| *G01R 15/24* | (2006.01) |
| *G02F 1/01* | (2006.01) |
| *G01R 19/00* | (2006.01) |
| *G02F 1/00* | (2006.01) |

(52) U.S. Cl.
CPC ....... *G01R 15/246* (2013.01); *G01R 19/0092* (2013.01); *G02F 1/0036* (2013.01); *G02F 1/0136* (2013.01); *G02F 1/09* (2013.01); *G02F 2201/02* (2013.01)

(58) Field of Classification Search
CPC . G01R 15/246; G01R 19/0092; G02F 1/0136; G02F 1/09; G02F 1/0036; G02F 2201/02; G02B 6/02033; G02B 6/3891; G02B 6/06; G02B 6/2558
See application file for complete search history.

(56) References Cited

U.S. PATENT DOCUMENTS

| | | | |
|---|---|---|---|
| 4,540,937 A | 9/1985 | Asars | |
| 4,894,608 A | 1/1990 | Ulmer, Jr. | |
| 4,947,107 A | 8/1990 | Doerfler et al. | |
| 4,973,899 A | 11/1990 | Jones et al. | |
| 5,486,754 A | 1/1996 | Cruden et al. | |
| 5,644,397 A | 7/1997 | Blake | |
| 7,068,025 B2* | 6/2006 | Bjorn | G01R 15/246 324/117 R |
| 8,655,115 B2 | 2/2014 | Oh | |
| 9,134,344 B2 | 9/2015 | Harlev et al. | |
| 9,494,809 B2 | 11/2016 | Yamada et al. | |
| 9,496,684 B2 | 11/2016 | Bagheri et al. | |
| 9,733,133 B2 | 8/2017 | Yao | |
| 2009/0212763 A1 | 8/2009 | Kurosawa et al. | |

(Continued)

*Primary Examiner* — Alvaro E Fortich
*Assistant Examiner* — Zannatul Ferdous
(74) *Attorney, Agent, or Firm* — Hovey Williams LLP

(57) ABSTRACT

An optical current monitor for detecting a current traveling through conductive material. The optical current monitor comprises a light source for emitting light at an output level; a lens configured to receive the light; Faraday material positioned near the conductive material and configured to receive light that has passed through the lens, thereby producing rotated light; a polarizer configured to polarize the rotated light; a photodetector configured to receive the rotated light and output a signal as a function of the rotated light; and a feedback system. The feedback system is configured to receive the signal from the photodetector and modify the output level of the light source based on the signal so that the signal remains at a reference level when the current is not traveling through the conductive material.

27 Claims, 3 Drawing Sheets

(56) References Cited

U.S. PATENT DOCUMENTS

2013/0278241 A1* 10/2013 Chen .................... G01R 15/247
324/95
2016/0033556 A1 2/2016 Mueller et al.
2016/0377660 A1* 12/2016 Muller ................. G01R 15/246
324/96

* cited by examiner

OPTICAL CURRENT MONITOR

STATEMENT REGARDING FEDERALLY-SPONSORED RESEARCH OR DEVELOPMENT

This invention was made with government support under Contract No.: DE-NA-0002839 awarded by the Department of Energy. The government has certain rights in the invention.

BACKGROUND

Optical current monitors monitor or measure current in a conductor without having to electrically couple to the conductor by measuring a rotation of polarized light as the light travels through material near the conductor. The rotation is caused by a magnetic field about the conductor induced by the current and is known as the Faraday effect.

One system for measuring the rotation of light employs a beam splitter that splits the light into two beams captured by two photodetectors. The photodetectors generate signals based on the received light. A processor may analyze the two signals and use trigonometry to find a rotation angle of the light, which has a linear relationship with the current of the conductor.

However, various optical losses in the system, such as changes in temperature or component degradation, cause the system to readily lose its calibration. Further, measuring the rotation of the light in this manner requires complex, non-robust optical and electronic components. For example, such systems often require single-mode fiber to guide the light, which is prone to alignment issues and is therefore sensitive to physical vibrations. Additionally, negative waveform components of the current cannot be captured.

The background discussion is intended to provide information related to the present invention which is not necessarily prior art.

SUMMARY

The present invention solves the above-described problems and other problems by providing an optical current monitor having a feedback system configured to modify the output of a light source based on a feedback signal so as to bias the signal at a reference level to account for optical losses, reduce inaccuracies as a result of the optical losses, measure an amplitude of the rotation change, detect negative currents, and enable use of multimode fiber, which is less prone to alignment issues.

An optical current monitor constructed in accordance with an embodiment of the present invention is provided for detecting a current traveling through a conductive material. The optical current monitor broadly comprises a light source for emitting light at an output level; a lens configured to receive the light; a Faraday material positioned near the conductive material and configured to receive light that has passed through the first lens, thereby producing rotated light; a polarizer configured to polarize the rotated light; a photodetector; and a feedback system. The photodetector is configured to receive the rotated light that has passed through the polarizer and output a signal as a function of the rotated light.

The feedback system is configured to receive the signal from the photodetector and modify the output level of the light source based on the signal so that the signal remains at a reference level when current is not traveling through the conductive material. Specifically, the feedback system increases the power output of the light source to modify the unpolarized light to account for any variations detected at the photodiode, such as a reduced signal due to optical losses caused by temperature changes and/or component degradation.

The above-described optical current monitor may also comprise a first fiber optic cable and a second fiber optic cable. The first fiber optic cable has a first end coupled to the light source so that the first fiber optic cable receives unpolarized light from the light source and guides the unpolarized light to a first collimator. The second fiber optic cable has a first end coupled to a second collimator so that the second fiber optic cable receives collimated, rotated light and guides it to the photodetector. The first and second fiber optic cables may include multimode fiber.

Another embodiment of the invention is a method of detecting a current traveling through a conductive material. The method broadly comprises emitting light from a light source at an output level; passing the light through a Faraday material positioned near the conductive material so that the light is rotated in the Faraday material due to a magnetic field induced by the current, thereby producing rotated light; polarizing the rotated light to produce polarized, rotated light; generating a signal based on the polarized, rotated light using a photodetector; determining a characteristic of the current traveling through the conductive material based on the signal; and modifying the output level of the light source based on the signal so that the signal remains at a reference level when current is not traveling through the conductive material.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein.

Figure 1:
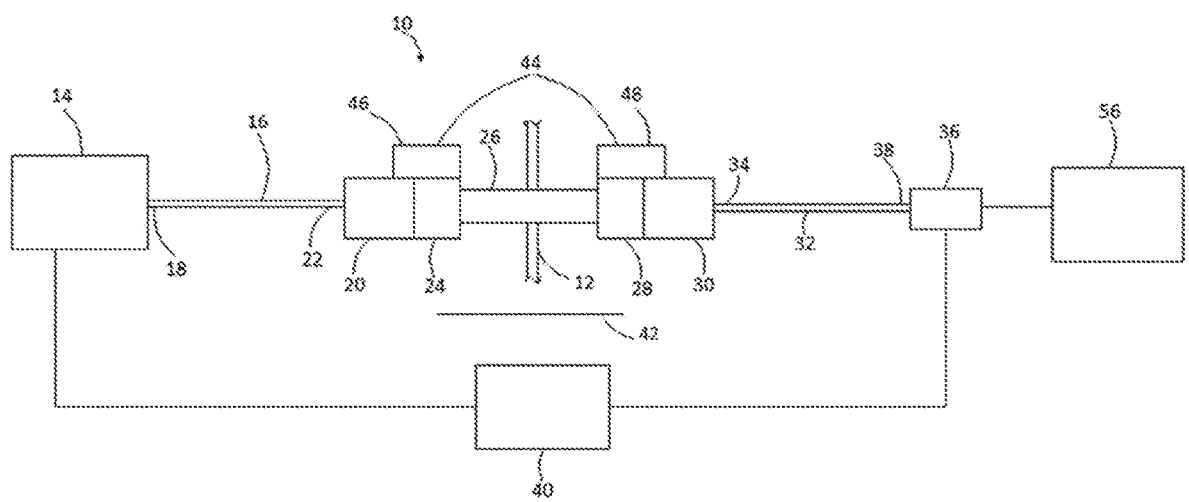
FIG. 1 is a schematic view of an exemplary optical current monitor constructed in accordance with embodiments of the invention.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Turning to FIG. 1, an optical current monitor 10 constructed in accordance with an embodiment of the invention is illustrated. The optical current monitor 10 monitors a current traveling through a conductor 12. The conductor 12 may be a wire, bus, cable, or any other conductive material. The current traveling through the conductor 12 may have a direct current (DC) component, an alternating current (AC) component, a complex wave component, a negative component, a positive component, and may be a pulse or impulse signal. The current monitor 10 may detect signals such as a current pulse in a conductor 12 that is part of a firing set, a high-power laser, a detonator, a power distribution system, a battery, a capacitor bank, test equipment, or the like.

The optical current monitor 10 may comprise a light source 14 for emitting light, a first fiber optic cable 16 having a first end 18 coupled to the light source 14 so that the first fiber optic cable 16 receives the light, a first lens 20 coupled to a second end 22 of the first fiber optic cable 16, a first polarizer 24 coupled to the first lens 20, a Faraday material 26 positioned near the conductive material 12, a second polarizer 28, a second lens 30 coupled to the second polarizer 28, a second fiber optic cable 32 having a first end 34 coupled to the second lens 30, a photodetector 36 coupled to a second end 38 of the second fiber optic cable 32, a feedback system 40, and a control system 56.

The light source 14 is provided for generating light for undergoing the Faraday effect. The light source 14 may have a known frequency and controllable output power. The light generated by the light source 14 may be polarized or unpolarized light. In some embodiments, the light source 14 is a laser.

The first fiber optic cable 16 is provided for receiving the light generated by the light source 14 and directing it to the first lens 20. The first fiber optic cable 16 receives the light from the light source 14 at the first end 18 of the first fiber optic cable 16. The first end 18 may be physically coupled to the light source 14. The first fiber optic cable 16 is operable to guide the light along its length to the first lens 20. The first fiber optic cable 16 may include single mode and/or multimode fiber. Even though multimode fiber may increase optical loss of the optical current monitor 10, the feedback system 40 may account for the optical loss. Thus, because the multimode fiber is less sensitive to alignment issues than single-mode fiber, it may improve stability and robustness of the optical current monitor 10. The first fiber optic cable 16 is multimode fiber when the light generated by the light source 14 is unpolarized. The second end 22 of the first fiber optic cable 16 may be coupled with the first lens 20.

The first lens 20 is provided for collimating, focusing, and/or aligning the light, thereby producing collimated, focused, and/or aligned light. The first lens 20 may be a collimator which receives the light from the light source 14 and collimates, focuses, and/or aligns it into the first polarizer 24 to reduce optical loss. The first lens 20 may be integrated with the first polarizer 24 so that the collimated, focused, and/or aligned light passes directly through the first lens 20 to the first polarizer 24. In some embodiments, the first lens 20 and first polarizer 24 may be aligned so that light passes through the first lens 20 to the first polarizer 24, or a fiber optic cable may be used to guide the focused light from the first lens 20 to the first polarizer 24. While applicant uses the word "lens" to describe lens 20, lens 20 may be any optical device that collimates, focuses, and/or aligns the light.

The first polarizer 24 may be optionally provided for polarizing the light, thereby producing polarized light. The first polarizer 24 is used if the light from the light source 14 is unpolarized. The first polarizer 24 filters out substantially all light not oscillating in a certain direction. Thus, the light passing through the first polarizer 24, or polarized light, oscillates in substantially one direction. By having light that oscillates in substantially one direction, the angle of the light going into the Faraday material 26 is known, and therefore a deviation from that angle is substantially due to the Faraday effect. The first polarizer 24 may be a linear polarizer and/or a polarizer plate. The first polarizer 24 is positioned so that the polarized light passes into the Faraday material 26.

The Faraday material 26 is provided for facilitating the Faraday effect on the polarized light. The Faraday material 26 is positioned so that the polarized light passing through the first polarizer 24 enters the Faraday material 26 and is rotated due to the Faraday effect, thereby producing rotated light. The Faraday material 26 is additionally positioned proximate to the conductor 12 so that the Faraday material 26 is within the current's magnetic field when the current travels through the conductor 12. The Faraday material 26 may have an axis 42 along its length and be oriented relative to the conductor 12 so that the axis 42 is perpendicular to the flow of the current in the conductor 12. The magnetic field induced by the current causes the polarized light to rotate about the axis 42. The angle of rotation of the polarized light has a linear relationship with the strength of the magnetic field induced by the current traveling through the conductor 12 and may be affected by a Verdet constant of the Faraday material 26. The angle of rotation may be used, in part, to determine the strength of the magnetic field, which may then be used to determine the current in the conductor 12. In some embodiments, the Faraday material 26 may include terbium gallium garnet (TGG) crystal having a relatively higher Verdet constant, which may amplify the Faraday effect experienced by the light, thereby increasing the granularity of the detected current. The Faraday material may additionally or alternatively include yttrium iron garnet (YIG) crystal. The Faraday material 26 may be positioned so that the rotated light exits the Faraday material 26 into the second polarizer 28.

The second polarizer 28 is provided for polarizing the rotated light, thereby producing polarized, rotated light. The second polarizer 28 is positioned so that it receives the rotated light from the Faraday material 26. The second polarizer 28 may have a different angle of polarization than the first polarizer 24 or the angle of polarized light emitted from the light source 14. The angle of polarization of the second polarizer 28 is known so that the rotation due to the Faraday effect can be determined. The second polarizer 28 may also be a linear polarizer and/or polarizer plate. The second polarizer 28 may be integrated with the second lens 30 so that the polarized, rotated light passes directly to the second lens 30. In some embodiments, the second polarizer 28 and second lens 30 may be aligned so that light passes through the second polarizer 28 to the second lens 30, or a fiber optic cable may be used to guide the polarized, rotated light from the second polarizer 28 to the second lens 30.

The second lens 30 may be optionally provided for collimating, focusing, and/or aligning the polarized, rotated light received from the second polarizer 28. Collimating, focusing, and/or aligning the polarized, rotated light may reduce optical loss as the light travels through the second fiber optic cable 32. Similar to the first lens 20, the second lens 30 may be a collimator configured to collimate the polarized, rotated light. The second lens 30 is coupled with a first end 34 of the second fiber optic cable 32. While applicant uses the word "lens" to describe the second lens 30, lens 30 may be any optical device that collimates, focuses, and/or aligns the light.

FIG. 1 depicts the first lens 20, the first polarizer 24, the Faraday material 26, the second polarizer 28, and the second lens 30 being positioned adjacent to each other. However, in some embodiments, the first lens 20, the first polarizer 24, the Faraday material 26, the second polarizer 28, and the second lens 30 may be positioned so that one or more spaces separate two or more of the components. The spaces may include fiber optic cables for guiding light passing therebetween. It is foreseen that the first lens 20, the first polarizer 24, the Faraday material 26, the second polarizer 28, and the second lens 30 may be positioned any number of ways without departing from the scope of the present invention.

The optical current monitor 10 may include an alignment feature such as a key 44 having a pair of protrusions 46, 48 for aligning the first lens 20 and the first polarizer 24 with the second polarizer 28 and the second lens 30. One of the protrusions 46 may be positioned on the first lens 20 and first polarizer 24, and the other protrusion 48 may be positioned on the second polarizer 28 and the second lens 30. It is foreseen that any number of alignment features may be used for aligning the first lens 20, the first polarizer 24, the Faraday material 26, the second polarizer 28, and the second lens 30 without departing from the scope of this invention.

The second fiber optic cable 32 is provided for receiving the focused, rotated light from the second lens 30 and guiding it to the photodetector 36. The second fiber optic cable 32 receives the focused, rotated light from the second lens 30 at the first end 34 of the second fiber optic cable 32. The first end 34 may be physically coupled to the second lens 30. In some embodiments, the second fiber optic cable 32 may also include multimode fiber for improving stability and robustness of the optical current monitor 10. The second end 38 of the second fiber optic cable 32 may be coupled with the photodetector 36.

The photodetector 36 is provided for converting the focused, rotated light into an electrical signal. The photodetector 36 is positioned to receive the focused, rotated light from the second fiber optic cable 32. The photodetector 36 is configured to convert the focused, rotated light into a signal representative of the focused, rotated light. The signal from the photodetector 36 is used to detect, monitor, and/or determine the current in the conductor 12. The signal may be a function of the photocurrent of the focused, rotated light and be affected by a responsivity of the photodetector 36. In other words, the electrical signal may be a function of the intensity of the rotated light. The photodetector 36 may include a photodetector amplifier (not shown) for amplifying its output.

Figure 2A:
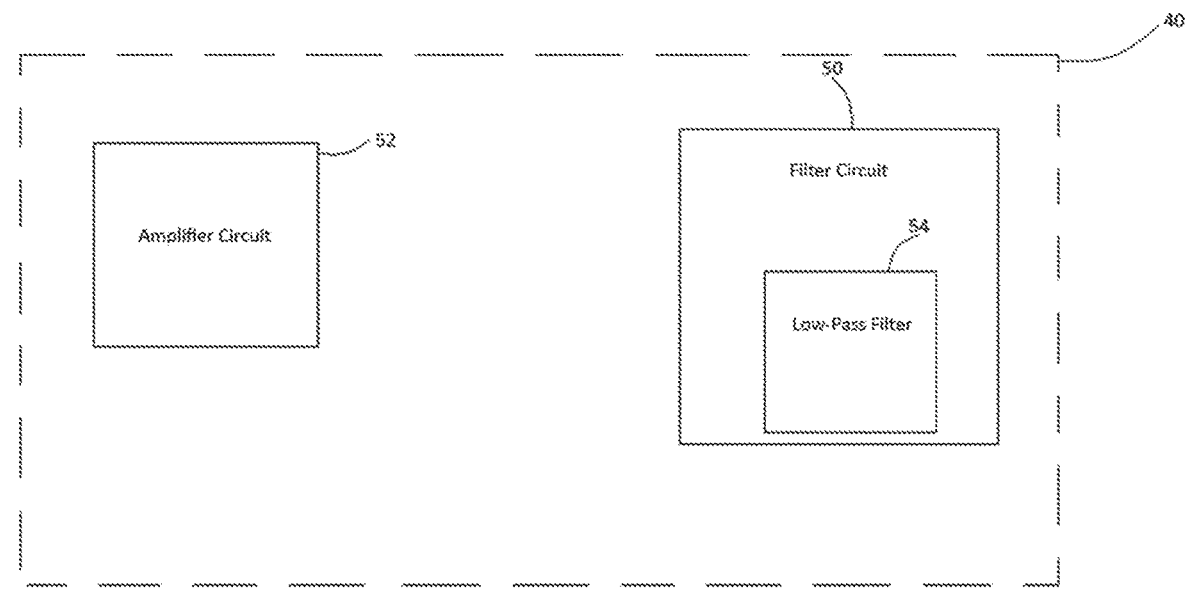
FIG. 2A is a block diagram of a feedback system of the optical current monitor of FIG. 1.

The feedback system 40 is provided for maintaining the output level of the light source 14 so that the signal from the photodetector 36 remains at a reference level when current is not traveling through the conductive material 12. The feedback system 40 is configured to receive the signal from the photodetector 36. The reference level may enable bipolar detection of the current traveling through the conductor 12. Any signal above the reference level indicates a positive current, and a signal below the reference level indicates a negative current. For example, for a system using a single rail power supply, the reference level may be above zero so that a positive current may be detected when the signal is above the reference level, and a negative current may be detected when the signal is below the reference level. As depicted in FIG. 2A, the feedback system 40 may include a filter circuit 50, and an amplifier circuit 52.

The filter circuit 50 is configured to filter out signals that are not meant to be detected by the current monitor 10. The filter circuit 50 may include any number of stages. The filter circuit 50 may include resistors, capacitors, inductors, comparators, amplifiers, or the like. As depicted in FIG. 2A, the filter circuit 50 may include an integrator circuit 54, or low-pass filter, for enabling lower frequency signals to pass through the feedback system 40 for modifying the output level of the light source 14. In other words, the filter circuit 50 may be configured to filter out higher frequency components of the signal to provide stability. For example, the low-pass filter 54 may include a resistor-capacitor (RC) combination having an RC time constant configured to enable frequencies below a certain threshold to pass through the feedback system 40. This prevents the reference level of the signal from being affected by the current that is meant to be detected and/or monitored.

The amplifier circuit 52 is provided for driving the light source 14 and modifying its output level so that the signal remains at the reference level when current is not traveling through the conductive material 12. For example, the amplifier circuit 52 may be configured to cause the output level of the light source 14 to be increased when an amplitude of the signal from the photodetector 36 is reduced due to, for example, optical loss caused by the multimode fiber or material degradation. The amplifier circuit 52 may increase the power provided to the light source 14, and thereby increase the output level of the light source 14. By accounting for optical loss, the amplifier circuit 52 enables the optical current monitor 10 to implement lossy multimode fiber, which improves the stability and robustness of the optical current monitor 10.

Figure 2B:
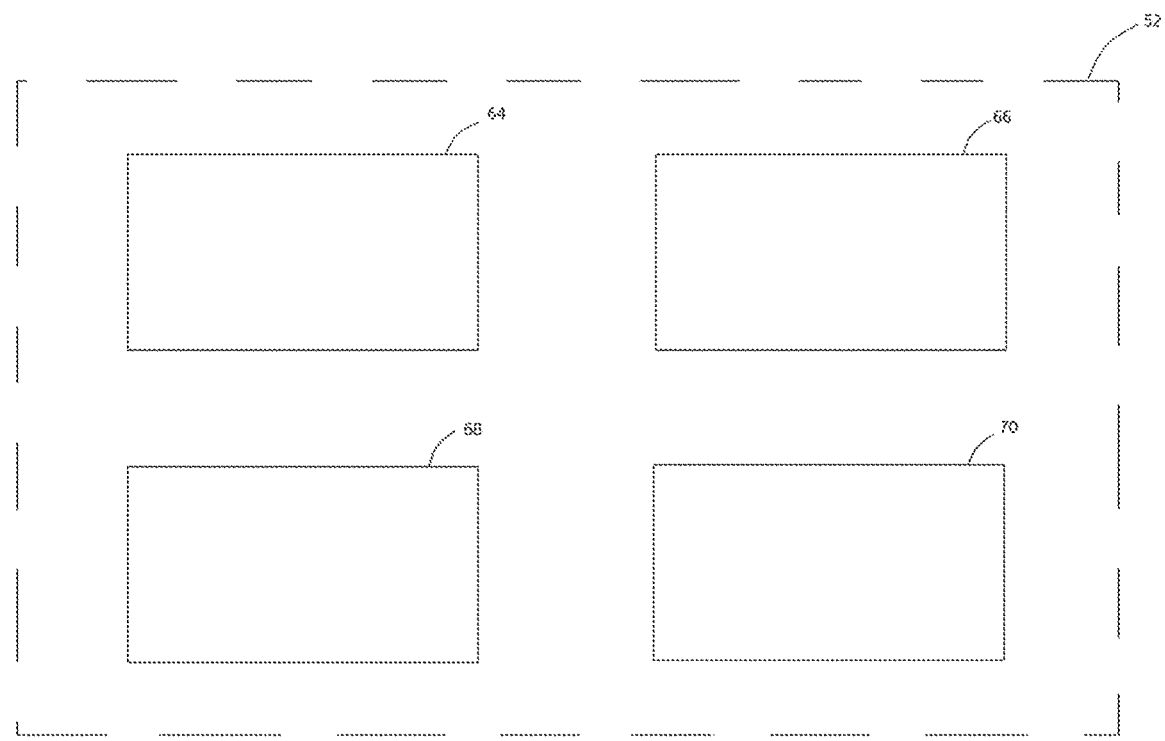
FIG. 2B is a block diagram of an amplifier circuit of the feedback system of FIG. 2A.

As shown in FIG. 2B, the amplifier circuit 52 may include a transimpedance amplifier 64, a signal amplifier 66, an integration circuit 68, and an amplifier 70 connected to the integration circuit 68. The transimpedance amplifier 64 may be configured to convert the signal generated by the photodetector 36 into an amplified voltage by use of transimpedance amplification. The signal amplifier 66 may be configured to amplify the transimpedance electrical signal and provide a stable electrical output drive capability. The integration circuit 68 may be configured to receive the voltage signal from the transimpedance amplifier 64 and output a voltage proportional to the input voltage integrated over time. The amplifier 70 connected to the integration circuit may be configured to control the optical output power of the light source 14 based on the signal amplifier 66 output so that when there is no current in the conductor 12, or under steady state conditions, the signal from the photodetector 36 is forced to the reference level.

While FIGS. 2A and 2B represent the filter circuit 50 and amplifier circuit 52 as being separate, the filter circuit 50 and amplifier circuit 52 may be integrated having components connected to each other in any configuration without departing from the scope of the present invention. Further, filter circuit 50 may include additional amplifiers, and amplifier circuit 52 may include additional filters.

Figure 3:
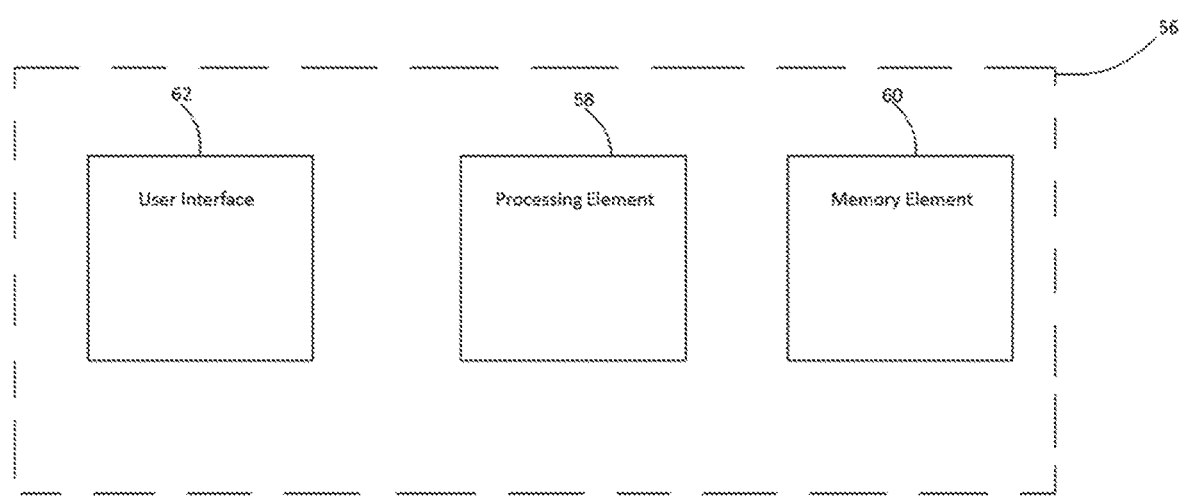
FIG. 3 is a block diagram of a control system of the optical current monitor of FIG. 1.

The control system 56 may also be configured to receive the signal from the photodetector 36, the photodetector amplifier, the amplifier circuit 52, and/or any other component of feedback system 40 and calculate one or more characteristics of the current traveling through the conductive material 12. As shown in FIG. 3, the control system 56 may include a processing element 58, a memory element 60, and a user interface 62.

The processing element 58 may run a computer program stored in or on computer-readable medium residing on the memory element 60 or otherwise accessible by the processing element 58. The computer program may preferably comprise ordered listings of executable instructions for implementing logical functions by the processing element 58. The computer program may be embodied in any computer-readable medium for use by or in connection with an instruction execution system, apparatus, or device, such as a computer-based system, processor-containing system, or other system that can fetch the instructions from the instruction execution system, apparatus, or device, and execute the instructions. In the context of this document, a "computer-readable medium" can be any means that can contain, store, communicate, propagate or transport the program for use by or in connection with the instruction execution system, apparatus, or device.

The computer-readable medium can be, for example, but is not limited to, an electronic, magnetic, optical, electromagnetic, infrared, or semi-conductor system, apparatus, device, or propagation medium. More specific, although not inclusive, examples of the computer-readable medium would include the following: an electrical connection having one or more wires, a portable computer diskette, a random-access memory (RAM), a read-only memory (ROM), an erasable, programmable, read-only memory (EPROM or Flash memory), an optical fiber, and a portable compact disk read-only memory (CDROM). The computer-readable medium may be one or more components incorporated into the control system 56 and/or other computing devices.

The memory element 60 of the control system 56 may include, for example, removable and non-removable memory elements such as RAM, ROM, flash, magnetic, optical, USB memory devices, and/or other conventional memory elements. The memory element 60 may store various data associated with the control system 56, such as the computer program and code segments mentioned above, or other data related to the signal to perform the steps described herein.

The user interface 62 may be in wired or wireless communication with the processing element 58 and be a remote user interface, such as a computer. The user interface 62 may generally allow the user to utilize inputs and outputs to interact with the control system 56. Inputs may include buttons, pushbuttons, knobs, jog dials, shuttle dials, directional pads, multidirectional buttons, switches, keypads, keyboards, mice, joysticks, microphones, or the like, or combinations thereof. Outputs may include audio speakers, lights, dials, meters, printers, or the like, or combinations thereof. With the user interface 62, the user may be able to view various electrical characteristics of the current traveling through the conductive material 12.

The processing element 58 may be configured to receive the signal from the photodetector 36, the photodetector amplifier, the amplifier circuit 52, and/or any other component of feedback system 40 and detect the current based on the signal. For example, the processing element 58 may include an analog-to-digital (ND) converter for converting the signal from analog to digital. The processing element 58 may calculate the amplitude of the current based on the signal. For example, the processing element 58 may be configured to calculate the amplitude of the current using, in part, the equations below, wherein a is representative of the rotation due to loss, $\theta$ is representative of the known difference between the polarization angles of the first polarizer 24 (or the polarization angle of the polarized light emitted from the light source 14) and the second polarizer 28, $\gamma_1$ is representative of the amplitude of the signal when no current is traveling through the conductive material 12 (i.e. the reference level), a is representative of the rotation of the light in the Faraday material 26 when the current travels through the conductive material 12 (i.e. the rotation due to the Faraday effect), and $\gamma_2$ is representative of the amplitude of the signal when the current travels through the conductive material 12. The processing element 58 may be configured to translate the amplitude of the signal to a value representative of the amplitude of the current based on, in part, specification data of the photodetector 36, such as the responsivity of the photodetector 36. The processing element 58 may also be configured to account for a Verdet constant of the Faraday material 26 as well as a length of the Faraday material 26.

$$\cos(\theta) = \frac{\gamma_1}{\alpha} \qquad (1)$$

$$\cos(\theta) = \frac{\gamma_1}{\gamma_2} \cdot \cos(\theta - \sigma) \qquad (2)$$

Additionally or alternatively, the processing element 58 may direct the memory element 60 to store the amplitude over time in order to determine the current's waveform and electrical properties. The processing element 58 may be configured to display an image representative of the current and/or electrical properties thereof on the user interface 62.

In use, the optical current monitor 10 is positioned near the conductive material 12. The light source 14 continuously emits light at an output level into the first fiber optic cable 16, which guides the light to the first lens 20. The first lens 20 focuses and/or collimates the light so that it is focused into the first polarizer 24 (if the light is unpolarized). If the light from the light source 14 is unpolarized, the first polarizer 24 may polarize the light at a known angle; the polarized light then passes through the Faraday material 26. If the current passes through the conductive material 12, then the light will rotate in the Faraday material 26. The rotated light exits the Faraday material 26 and enters the second polarizer 28, which polarizes the light at a known angle. The light then passes through the second lens 30, which focuses and/or collimates the light into the second fiber optic cable 32. The second fiber optic cable 32 guides the light to the photodetector 36 which outputs a signal representative of the light.

The feedback system 40 receives the signal and modifies the output level of the light source 14 so that the signal remains at a reference level, which may be set during calibration. The feedback system 40 filters out signals having a frequency or speed in the range of the current to be detected so that the reference level is unaffected by such signals and the current may be detected by the control system 56. The control system 56 receives the signal and may be configured to determine when the current is traveling through the conductive material 12, and/or display an indication of the presence of the current and/or an image representative thereof, based on the signal. For example, a positive pulse current traveling through the conductive material 12 would cause the light in the Faraday material 26 to rotate resulting in an increase of the amplitude of the signal. The control system 56 may be configured to detect such an increase in amplitude of the signal and provide an indication thereof.

Figure 4:
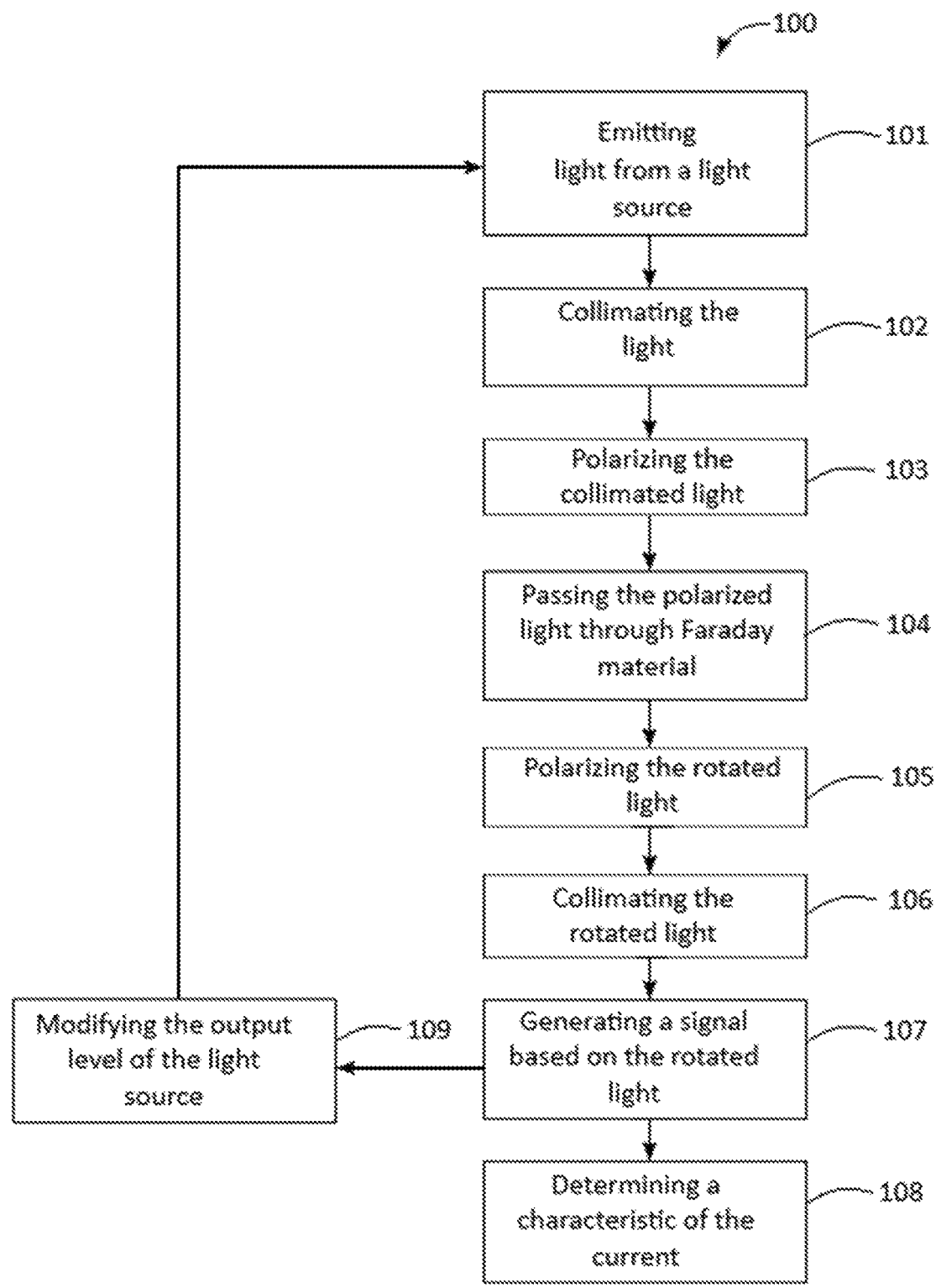
FIG. 4 is a flowchart illustrating at least a portion of the steps for detecting a current traveling through a conductive material.

The flow chart of FIG. 4 depicts the steps of an exemplary method 100 of detecting the current traveling through the conductive material. In some alternative implementations, the functions noted in the various blocks may occur out of the order depicted in FIG. 4. For example, two blocks shown in succession in FIG. 4 may in fact be executed substantially concurrently, or the blocks may sometimes be executed in the reverse order depending upon the functionality involved. In addition, some steps may be optional.

The method 100 is described below, for ease of reference, as being executed by exemplary devices and components introduced with the embodiments illustrated in FIGS. 1-3. For example, the steps of the method 100 may be performed by the optical current monitor 10, the light source 14, the first fiber optic cable 16, the first lens 20, the first polarizer 24, the Faraday material 26, the second polarizer 28, the second lens 30, the second fiber optic cable 32, the photodetector 36, the feedback system 40, and the control system 56 through the utilization of processors, transceivers, hardware, software, firmware, or combinations thereof. However, a person having ordinary skill will appreciate that responsibility for all or some of such actions may be distributed differently among such devices or other computing devices without departing from the spirit of the present invention. One or more computer-readable medium(s) may also be provided. The computer-readable medium(s) may include one or more executable programs stored thereon, wherein the program(s) instruct one or more processing elements to perform all or certain of the steps outlined herein. The program(s) stored on the computer-readable medium(s) may instruct the processing element(s) to perform additional, fewer, or alternative actions, including those discussed elsewhere herein.

Referring to step 101, light may be emitted from a light source at an output level. The light may be unpolarized or polarized light and may be emitted continuously or in intervals. The output level may initially be set via calibration and may be modified by the feedback system, as discussed above and in step 109 below. In some embodiments, the light may be emitted into a fiber optic cable coupled to the light source. The fiber optic cable may include single mode and/or multimode fiber.

Referring to step 102, the light from the light source may be focused and/or collimated to produce a collimated light. Collimating the light focuses it in order to reduce optical loss. The light may be collimated using a collimator, such as the lens discussed above, and it may be received from a fiber optic cable, such as a multi-mode fiber optic cable. The light may alternatively or additionally be focused by a focusing lens.

Referring to step 103, the collimated light may be polarized. If the light emitted from the light source is unpolarized, the light may be polarized so that substantially one angle of the light undergoes the Faraday effect. The angle of polarization may be known so that the rotation due to the Faraday effect can be determined. The polarizing may be accomplished using the first polarizer.

Referring to step 104, the polarized light may be passed through the Faraday material positioned near the conductive material, thereby producing rotated light. The light may be rotated as it passes through the Faraday material due to a magnetic field induced by the current in the conductive material. The magnitude of rotation may be based, in part, on the length of the Faraday material, the Verdet constant of the Faraday material, and the magnitude of the current. When there is no current traveling through the Faraday material, the Faraday rotation may be substantially zero or nominal and accounted for when modifying the output level of the light source, as discussed below.

Referring to step 105, the rotated light may be polarized to produce polarized, rotated light. The polarizing may be done using the second polarizer. The angle of polarization may be a known angle so that it may be accounted for when calculating the angle of rotation due to the Faraday effect.

Referring to step 106, the polarized, rotated light may be focused and/or collimated. The collimating/focusing may be accomplished using a lens and/or collimator, as discussed above. The collimating/focusing may be provided for focusing the light to reduce optical loss.

Referring to step 107, a signal may be generated based on the rotated light. The signal may be an electrical signal representative of the light. The signal may be generated by a photodetector, such as a photodiode, as discussed above. The signal may be a function of the photocurrent of the rotated light, which is affected by the Faraday effect induced by current traveling through the conductor.

Referring to step 108, a characteristic of the current traveling through the conductor may be determined based on the signal. The characteristic may be determined based on, in part, an amplitude of signal, a length of the Faraday material, or other variables, as discussed above. The characteristic may be any electrical measurement of the signal, such as the amplitude of the current, the amplitude over time, a frequency of a sinusoidal component of the current, etc.

Referring to step 109, the output level of the light source may be modified based on the signal so that the signal remains at a reference level when current is not traveling through the conductive material. The output level of the light source may be modified using a feedback system. For example, if optical losses cause the signal to go below the reference level when there is no current traveling through the conductive material, the output level of the light source may be increased so that the signal achieves the reference level.

The method 100 may include additional, less, or alternate steps and/or device(s), including those discussed elsewhere herein. For example, the step of modifying the output level of the light source may include filtering out signals having a certain frequency, such as high frequency signals, so that the reference level is unaffected by such signals.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. An optical current monitor for detecting a current traveling through a conductive material, the optical current monitor comprising:
   a light source for emitting light at an output level;
   a lens configured to receive the light;
   a Faraday material positioned near the conductive material and configured to receive light that has passed through the lens, thereby producing rotated light;
   a polarizer configured to polarize the rotated light;
   a photodetector configured to—
      receive the rotated light that has passed through the polarizer, and
      output a signal as a function of the rotated light; and
   a feedback system configured to—
      receive the signal from the photodetector, and
      modify the output level of the light source based on the signal so that the signal remains at a reference level when the current is not traveling through the conductive material.

2. The optical current monitor of claim 1, the Faraday material including at least one of terbium gallium garnet (TGG) crystal and yttrium iron garnet (YIG) crystal.

3. The optical current monitor of claim 1, wherein the light emitted by the light source is polarized light.

4. The optical current monitor of claim 3, wherein the lens is a collimator configured to collimate the polarized light.

5. The optical current monitor of claim 1, the light emitted by the light source being unpolarized light, further comprising an additional polarizer configured to polarize the unpolarized light so that the Faraday material receives polarized light.

6. The optical current monitor of claim 5, further comprising multimode fiber optic cable coupled to the light source for guiding the unpolarized light to the lens.

7. The optical current monitor of claim 5, wherein the additional polarizer is configured to receive the unpolarized light from the lens.

8. The optical current monitor of claim 1, the feedback system including an integrator circuit.

9. The optical current monitor of claim 1, further comprising a second lens configured to focus the rotated light from the Faraday material.

10. The optical current monitor of claim 1, further comprising a control system configured to determine an amplitude of rotation of the rotated light based on the signal from the photodetector.

11. The optical current monitor of claim 1, wherein the reference level is above zero so that a positive and negative component of the current traveling through the conductor can be detected.

12. A method of detecting a current traveling through a conductive material, the method comprising the steps of:
   emitting light from a light source at an output level;
   passing the light through a Faraday material positioned near the conductive material so that the light is rotated in the Faraday material due to a magnetic field induced by the current, thereby producing rotated light;
   polarizing the rotated light to produce polarized, rotated light;
   generating a signal based on the polarized, rotated light using a photodetector;
   determining a characteristic of the current traveling through the conductive material based on the signal; and
   modifying the output level of the light source based on the signal so that the signal remains at a reference level when current is not traveling through the conductive material.

13. The method of claim 12, further comprising the steps of:
   guiding the light from the light source through a multimode fiber; and
   guiding the polarized, rotated light through a multimode fiber.

14. The method of claim 12, wherein the modifying step includes integrating the signal over time.

15. The method of claim 12, wherein the modifying step includes passing the signal through an amplifier circuit.

16. The method of claim 12, wherein the Faraday material includes at least one of terbium gallium garnet (TGG) crystal and yttrium iron garnet (YIG) crystal.

17. The method of claim 12, wherein the photodetector includes a photodiode.

18. An optical current monitor for detecting a current in a conductive material, the optical current monitor comprising:
   a light source for emitting unpolarized light at an output level;
   a first fiber optic cable having a first end and a second end, the first end being coupled to the light source so that the first fiber optic cable receives the unpolarized light;
   a first collimator coupled to the second end of the first fiber optic cable and configured to collimate the unpolarized light, thereby producing collimated light;
   a first polarizer coupled to the first collimator and configured to polarize the collimated light, thereby producing polarized light;
   a Faraday material positioned near the conductive material and configured to receive polarized light from the first polarizer, thereby producing rotated light;
   a second polarizer configured to receive and polarize the rotated light, thereby producing polarized, rotated light;
   a second collimator coupled to the second polarizer and configured to collimate the polarized, rotated light, thereby producing collimated, rotated light;
   a second fiber optic cable having a first end and a second end, the first end being coupled to the second collimator so that the second fiber optic cable receives the collimated, rotated light;
   a photodetector coupled to the second end of the second fiber optic cable and configured to—
      receive the collimated, rotated light, and
      output a signal as a function of the collimated, rotated light; and
   a feedback system connected to the photodetector and the light source, the feedback system including—
      a filter circuit configured to receive the signal from the photodetector and filter out undesired signal components, and
      an amplifier connected to the filter circuit and the light source, the amplifier being configured to modify the output level of the light source based on the signal so that the signal remains at a reference level when current is not traveling through the conductive material.

19. The optical current monitor of claim 18, the first fiber optic cable and the second fiber optic cable including multimode fiber.

20. The optical current monitor of claim 18, the Faraday material including at least one of terbium gallium garnet (TGG) crystal and yttrium iron garnet (YIG) crystal.

21. A method of detecting a current traveling through a conductive material, the method comprising the steps of:
    emitting light from a light source at an output level;
    passing the light through a Faraday material positioned near the conductive material so that the light is rotated in the Faraday material due to a magnetic field induced by the current, thereby producing rotated light;
    polarizing the rotated light to produce polarized, rotated light;
    generating a signal based on the polarized, rotated light using a photodetector; and
    modifying the output level of the light source based on the signal so that the signal remains at a reference level when current is not traveling through the conductive material.

22. The method of claim 21, further comprising the steps of: guiding the light from the light source through a multimode fiber; and guiding the polarized, rotated light through the multimode fiber.

23. The method of claim 21, wherein the modifying step includes integrating the signal over time.

24. The method of claim 21, wherein the modifying step includes passing the signal through an amplifier circuit.

25. The method of claim 21, wherein the Faraday material includes at least one of terbium gallium garnet (TGG) crystal and yttrium iron garnet (YIG) crystal.

26. The method of claim 21, wherein the photodetector includes a photodiode.

27. The method of claim 21, further comprising collimating the light from the light source to produce collimated light and polarizing the collimated light to produce polarized, collimated light, wherein the light passed through the Faraday material is the polarized, collimated light.

\* \* \* \* \*